(12) United States Patent
Bhargava et al.

(10) Patent No.: US 9,246,509 B1
(45) Date of Patent: Jan. 26, 2016

(54) METHODS AND APPARATUS FOR OFFLINE MISMATCH REMOVAL IN SIGMA DELTA ANALOG-TO-DIGITAL CONVERTERS

(71) Applicant: STMicroelectronics Pvt. Ltd., Greater Noida (IN)

(72) Inventors: Neha Bhargava, Greater Noida (IN); Ankur Bal, Greater Noida (IN)

(73) Assignee: STMICROELECTRONICS INTERNATIONAL N.V., Amsterdam (NL)

( * ) Notice: Subject to any disclaimer, the term of this patent is extended or adjusted under 35 U.S.C. 154(b) by 0 days.

(21) Appl. No.: 14/474,945

(22) Filed: Sep. 2, 2014

(51) Int. Cl.
*H03M 3/02* (2006.01)
*H03M 3/00* (2006.01)

(52) U.S. Cl.
CPC .............. *H03M 3/386* (2013.01); *H03M 3/412* (2013.01); *H03M 3/424* (2013.01); *H03M 3/458* (2013.01)

(58) Field of Classification Search
USPC ................................................. 341/143, 145
See application file for complete search history.

(56) References Cited

U.S. PATENT DOCUMENTS

| | | | | |
|---|---|---|---|---|
| 5,977,899 A * | 11/1999 | Adams | ..................... | H03M 3/50 341/143 |
| 5,986,595 A * | 11/1999 | Lyden | ................. | H03M 1/0668 341/118 |
| 6,515,607 B2 * | 2/2003 | Liu | ........................ | H03M 1/066 341/118 |
| 6,744,392 B2 * | 6/2004 | Melanson | ............... | H03M 3/35 341/118 |
| 9,094,040 B2 * | 7/2015 | Koli | ....................... | H03M 3/462 |

* cited by examiner

*Primary Examiner* — Howard Williams
(74) *Attorney, Agent, or Firm* — Seed IP Law Group PLLC

(57) ABSTRACT

A sigma delta analog-to-digital converter includes a sigma delta modulator including a segmented digital-to-analog converter (DAC), the segmented DAC including a coarse DAC and a fine DAC, wherein the sigma delta modulator is configured to generate a coarse quantized signal and a fine quantized signal; recombination logic configured to combine the coarse quantized signal and the fine quantized signal; and a calibration circuit, operable in a calibration mode, to calibrate the recombination logic to compensate for mismatch between the coarse DAC and the fine DAC of the segmented DAC.

24 Claims, 6 Drawing Sheets though the benefits of large internal quantization come at the cost of designing an error free multibit feedback digital-to-analog converter (DAC), as the non-linearity errors of the DAC are not shaped by the sigma delta loop. Data Weighted Averaging (DWA) techniques have been used for DAC linearization. But the hardware complexity of DWA is exponentially proportional to the number of bits, adds extra delay in the feedback path and increases the overall power consumption of the ADC.

METHODS AND APPARATUS FOR OFFLINE MISMATCH REMOVAL IN SIGMA DELTA ANALOG-TO-DIGITAL CONVERTERS

BACKGROUND

1. Technical Field

This disclosure relates to sigma delta analog-to-digital converters and, more particularly, to mismatch removal in multibit sigma delta analog-to-digital converters.

2. Discussion of Related Art

The use of multibit quantization in sigma delta analog-to-digital converters (ADCs) is known to impart many advantages, such as high resolution at low oversampling ratios, and better stability and tone behavior. With the proliferation in use of high speed and low power continuous time (CT) modulators, multibit quantization has become important because of its immunity to clock jitter. However, the benefits of large internal quantization come at the cost of designing an error free multibit feedback digital-to-analog converter (DAC), as the non-linearity errors of the DAC are not shaped by the sigma delta loop. Data Weighted Averaging (DWA) techniques have been used for DAC linearization. But the hardware complexity of DWA is exponentially proportional to the number of bits, adds extra delay in the feedback path and increases the overall power consumption of the ADC.

One proposed technique uses a folding or a two-step ADC to reduce power dissipation of the internal quantizer and applies Data Weighted Averaging to the segmented coarse and fine DACs. This technique uses an inter DAC calibration approach entirely in the analog domain and operates a single bit modulator which is inherently linear at high Over Sampling Ratio (OSR) to estimate the average gain of the coarse and fine DACs, and then adjusts the weight of a unit element in the fine DAC so that the ratio of their average gains is equal to the ideal value. This approach involves complexity in control and implementation in the analog circuit and may be less accurate.

Accordingly, there is a need for calibration methods and apparatus for sigma delta analog-to-digital converters.

SUMMARY

Mismatch between the coarse DAC and the fine DAC in a segmented sigma delta ADC architecture can degrade the signal-to-noise ratio substantially. In one example, the signal-to-noise ratio is reduced from 115 dB with no mismatch to 81 dB in the presence of 1% mismatch between the coarse DAC and the fine DAC. In embodiments, digital calibration is used to replicate the mismatch between the average gains of the coarse and fine DACs in the digital block of the sigma delta ADC. An offline calibration procedure is defined for this purpose. The primary ADC input is grounded and a test signal, which can be random number or DC, is injected into the loop at a digital node to excite the system. The test signal follows the same path as the quantization error and is subject to the high pass noise transfer function. The technique accurately estimates and corrects mismatch errors.

According to one embodiment, a sigma delta analog-to-digital converter comprises a first summing unit having a first input to receive an analog input, a loop filter configured to filter an output of the first summing unit, a quantizer configured to quantize an output of the loop filter and to provide a coarse quantized signal and a fine quantized signal, a segmented digital-to-analog converter (DAC) including a coarse DAC to receive the coarse quantized signal, a fine DAC to receive the fine quantized signal and a second summing unit to combine outputs of the coarse DAC and the fine DAC and to provide a feedback signal to a second input of the first summing unit, recombination logic configured to combine the coarse quantized signal and the fine quantized signal, and a calibration circuit, operable in a calibration mode, to calibrate the recombination logic to compensate for mismatch between the coarse DAC and the fine DAC of the segmented DAC.

In some embodiments, the recombination logic comprises a first gain element configured to process the coarse quantized signal, a second gain element configured to process the fine quantized signal and a third summing unit configured to combine outputs of the first and second gain elements.

In some embodiments, the sigma delta analog-to-digital converter further comprises a decimation filter coupled to an output of the recombination logic, wherein the decimation filter provides an error signal to the calibration circuit in the calibration mode.

In some embodiments, the decimation filter comprises a sinc decimation filter.

In some embodiments, the calibration circuit includes a calibration controller adapted to configure the sigma delta analog-to-digital converter for calibration and to control a calibration process.

In some embodiments, the calibration circuit further includes a calculation unit configured to generate an updated gain value.

In some embodiments, the updated gain value adjusts a gain of the coarse quantized signal in the recombination logic.

In some embodiments, the calculation unit implements a Least Mean Square algorithm.

In some embodiments, the calibration circuit further includes a comparator configured to compare the error signal with a threshold value.

In some embodiments, the calibration controller is configured to ground the analog input and to apply a digital test value to the sigma delta analog-to-digital converter in the calibration mode.

In some embodiments, the segmented digital-to-analog converter includes a first data weighted averaging unit operable with the coarse DAC and a second data weighted averaging unit operable with the fine DAC.

In some embodiments, the calculation unit generates the updated gain value G(n+1) as follows:

$$G(n+1)=G(n)+mu \cdot Y_C(n) \cdot e(n)$$

where n is a time index, e(n) is the error signal, mu is a step size of the Least Mean Square algorithm, $Y_C(n)$ is the coarse quantized signal and G(n) is a current gain value.

In some embodiments, the calibration circuit adjusts a gain value of the first gain element to an average gain of the coarse DAC.

In some embodiments, the second gain element is configured to have unity gain.

In some embodiments, the calibration controller is configured to execute iterations of generating an updated gain value while the error signal is greater than the threshold value.

According to another embodiment, a calibration method is provided for a sigma delta analog-to-digital converter having a segmented digital-to-analog converter (DAC) and recombination logic. The calibration method comprises detecting an error signal representative of gain mismatch between a coarse DAC and a fine DAC in the segmented DAC; and adjusting a gain of a gain element in the recombination logic to compensate for the gain mismatch, based on the error signal.

According to another embodiment, a sigma delta analog-to-digital converter comprises a sigma delta modulator including a segmented digital-to-analog converter (DAC), the segmented DAC including a coarse DAC and a fine DAC, wherein the sigma delta modulator is configured to generate a coarse quantized signal and a fine quantized signal; recombination logic configured to combine the coarse quantized signal and the fine quantized signal; and a calibration circuit, operable in a calibration mode, to calibrate the recombination logic to compensate for mismatch between the coarse DAC and the fine DAC of the segmented DAC.

BRIEF DESCRIPTION OF THE DRAWINGS

For a better understanding of the embodiments, reference is made to the accompanying drawings, which are incorporated herein by reference and in which.

DETAILED DESCRIPTION

Figure 1:
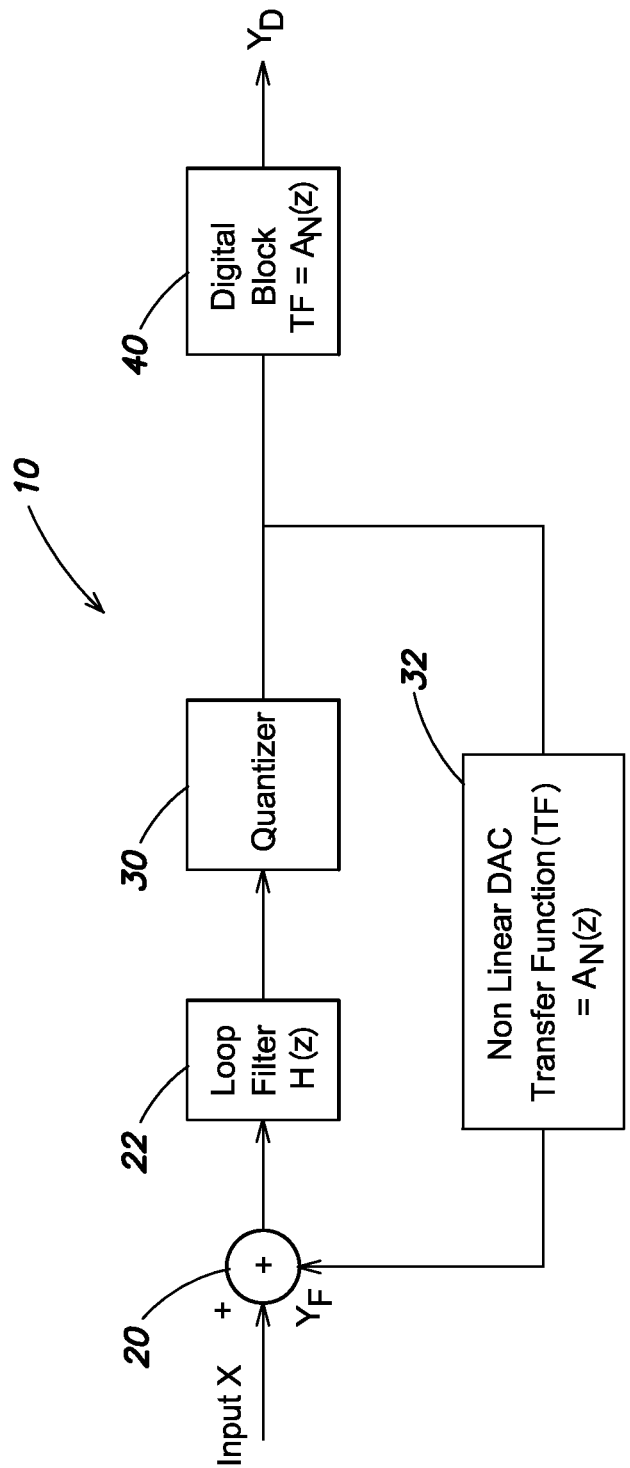
FIG. 1 is a schematic block diagram of a multibit sigma delta analog-to-digital converter with digital non-linearity correction.

A multibit sigma delta analog-to-digital converter (ADC) 10 is shown in FIG. 1. The multibit sigma delta ADC 10 includes a summing unit 20 having a first input that receives an analog input X. The summing unit 20 supplies an output to a loop filter 22, which may be an integrator. The loop filter 22 has a transfer function H(z). A quantizer 30 receives an output of loop filter 22 and provides a digital output to an input of a non-linear DAC 32. An output $Y_F$ of non-linear DAC 32 is supplied to a second input of summing unit 20 to form a negative feedback loop. The output of quantizer 30 is also supplied to a digital block 40. An output $Y_D$ of digital block 40 provides an output of the sigma delta ADC 10. The DAC 32 and the digital block 40 may each have a transfer function TF=$A_N(z)$.

Digital correction of non-linear distortion is performed in the sigma delta ADC 10 shown in FIG. 1. The loop filter 22 is an integrator and has an infinite gain at DC and very high gain for signal band frequencies. The negative feedback loop forces the analog signal $Y_F$ to follow the input signal X at low pass frequencies. The digital block 40, having the same transfer function as the DAC 32, reconstructs the linear and high resolution output $Y_D$=$Y_F$ in the digital domain.

Figure 2:
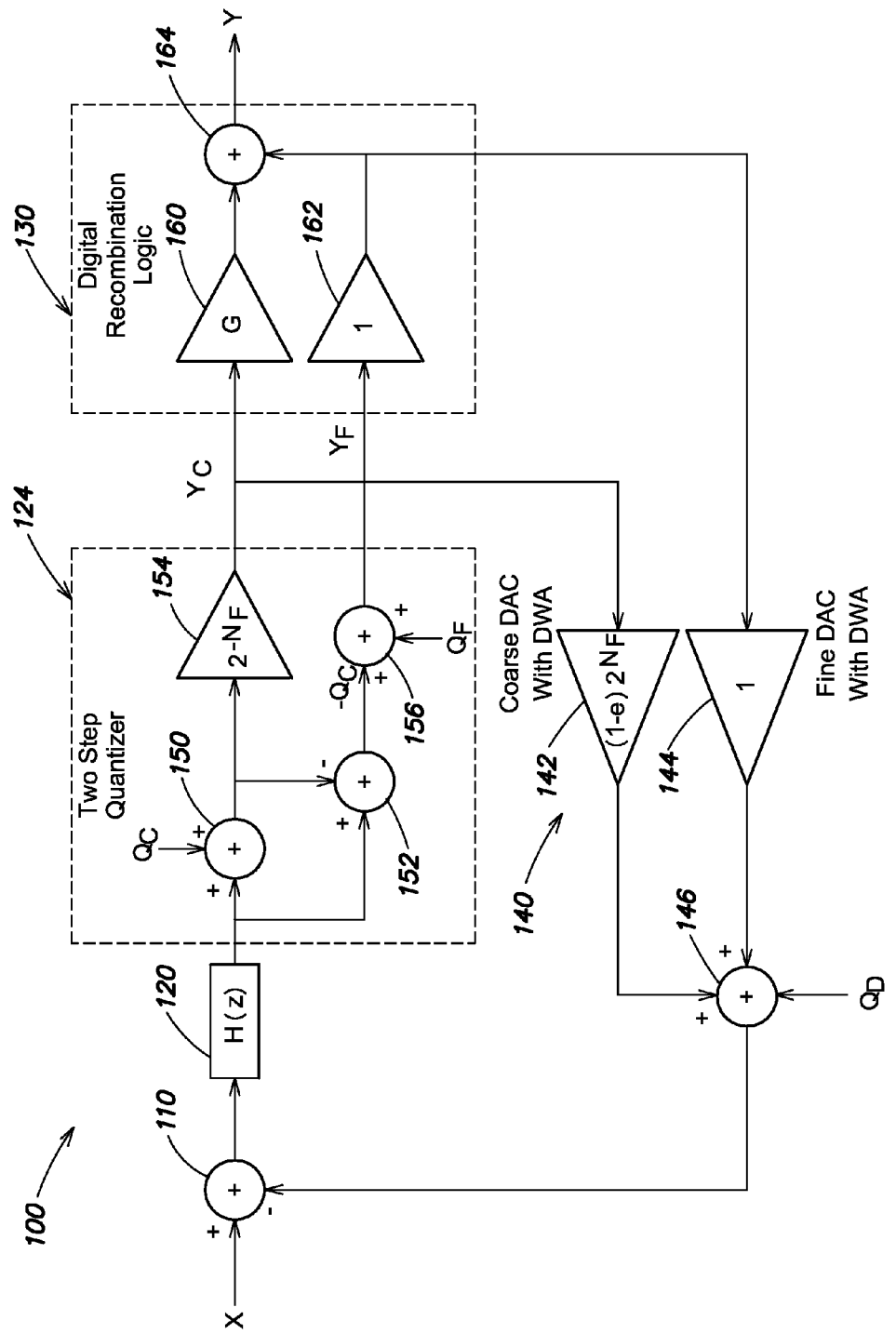
FIG. 2 is a schematic block diagram of a segmented sigma delta analog-to-digital converter.

A block diagram of a segmented sigma delta ADC 100 is shown in FIG. 2. The segmented sigma delta ADC 100 includes a summing unit 110 having a first input that receives an analog input signal X. The summing unit 110 supplies an output to a loop filter 120. A two-step quantizer 124 receives the output of loop filter 120 and provides a coarse quantized signal $Y_C$ and a fine quantized signal $Y_F$ to digital recombination logic 130. A segmented DAC 140 includes a coarse DAC 142 with Data Weighted Averaging (DWA), a fine DAC 144 with DWA, and a summing unit 146. The coarse DAC 142 receives the coarse quantized signal $Y_C$ from two-step quantizer 124. The fine DAC 144 receives the fine quantized signal $Y_F$ from digital recombination logic 130. The outputs of coarse DAC 142 and fine DAC 144 are supplied to respective inputs of a summing unit 146, and the output of summing unit 146 is supplied to a second input of summing unit 110 to form a negative feedback loop.

As shown in FIG. 2, the two-step quantizer 124 includes a summing unit 150, a summing unit 152, a gain element 154 and a summing unit 156. The summing unit 150 receives the output of loop filter 120 and a coarse quantization error $Q_C$. The summing unit 152 receives the output of loop filter 120 and the output of summing unit 150. The gain element 154 receives the output of summing unit 150 and provides the coarse quantized signal $Y_C$. The summing unit 156 receives the output of summing unit 152 and a fine quantization error $Q_F$. The output of summing unit 156 is provided as the fine quantized signal $Y_F$.

As further shown in FIG. 2, the digital recombination logic 130 includes a gain element 160 that receives the coarse quantized signal $Y_C$, and a gain element 162 that receives the fine quantized signal $Y_F$. Outputs of gain elements 160 and 162 are supplied to respective inputs of a summing unit 164 which provides an output signal Y.

The two-step quantizer 124 of segmented sigma delta ADC 100 produces $N_C$ bits of coarse quantized signal and $N_F$ bits of fine quantized signal with an overall resolution of (N=$N_C$+$N_F$) bits. The coarse and fine signals $Y_C$ and $Y_F$ are applied to coarse DAC 142 and fine DAC 144, respectively, after scrambling through two independent DWA units. The hardware complexity of the DWA units in terms of the number of unit elements and switches is simplified from the original $2^N$ to $2^{N_C}+2^{N_F}$. The delay and power consumption are also reduced. The gain element 154 has a gain of $2^{N_F}$ in order to restore the coarse quantized signal to its full dynamic range in the analog domain. The coarse quantized signal is recombined with the fine quantized signal in the segmented DAC 140. However, the analog gain implemented in segmented DAC 140 is not precise due to process variations.

The Data Weighted Averaging units enable each DAC to be modeled with its average gain over time, the fine DAC 144 with a gain of 1 and the coarse DAC 142 with a gain of (1−e) $2^{N_F}$, where the term (1−e) arises due to mismatch between coarse DAC 142 and fine DAC 144. The gain mismatch between the coarse DAC 142 and the fine DAC 144 gives rise to harmonic distortion error $Q_D$, shown in FIG. 2 as an input to summing unit 146.

The digital output Y can be expressed in terms of coarse and fine quantization errors $Q_C$ and $Q_F$, respectively, and harmonic distortion error $Q_D$. In the presence of zero gain mismatch, where e=0 and harmonic distortion error $Q_D$=0:

$$Y = \frac{X \cdot H(z)}{1 + H(z)} + \frac{Q_F}{1 + H(z)} \quad (1)$$

In the presence of gain mismatch (1−e):

$$Y = \frac{X \cdot H(z)}{1 + (1-e) \cdot H(z)} + \frac{e \cdot (Q_C - Q_F) \cdot H(z)}{1 + (1-e) \cdot H(z)} + \frac{Q_F}{1 + (1-e) \cdot H(z)} - \frac{Q_D \cdot H(z)}{1 + (1-e) \cdot H(z)} \quad (2)$$

The output Y in this case contains an error term proportional to ($Q_C$−$Q_F$).e and the distortion error $Q_D$ in the signal band. Simulations of a second order modulator with N=8 bits at an OSR of 32 show that +/−1% unit element mismatch between the 4-bit coarse DAC 142 and the 4-bit fine DAC 144 can degrade the signal-to-noise ratio from an ideal value of 112 dB to 75 dB.

In constructing the digital output Y from the coarse and fine quantizer outputs, an ideal gain of $G=2^{N_F}$ is used in the digital logic, which is different from the actual gain of the coarse DAC 140. If the actual gain of the coarse DAC 140, which is $(1-e) \, 2^{N_F}$ is used in the digital logic, the output Y can be expressed as:

$$Y = \frac{(1-e) \cdot X \cdot H(z)}{1 + (1-e) \cdot H(z)} - \frac{e \cdot Q_C}{1 + (1-e) \cdot H(z)} + \frac{Q_F}{1 + (1-e) \cdot H(z)} + \frac{Q_D}{1 + (1-e) \cdot H(z)} \quad (3)$$

The output Y now includes an error term $e.Q_C$ which is a small fraction of $Q_C$ and the distortion error $Q_D$, both of which are high pass filtered by the noise transfer function. The mismatch term $(1-e)$ alters the ideal signal transfer function and the noise transfer function.

Figure 3:
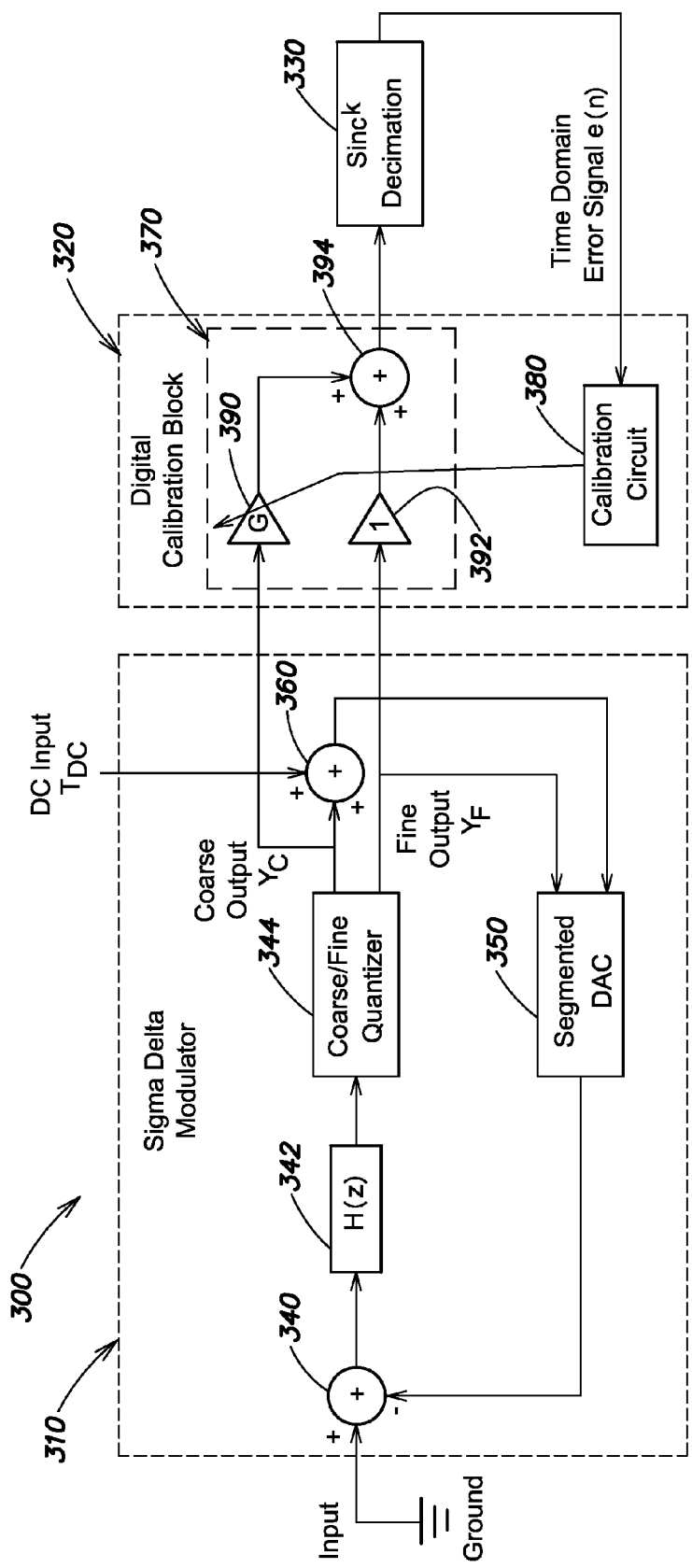
FIG. 3 is a schematic block diagram of a sigma delta ADC incorporating an offline digital calibration technique in accordance with embodiments.

A block diagram of a segmented sigma delta ADC 300 in accordance with embodiments is shown in FIG. 3. The segmented sigma delta ADC 300 includes a sigma delta modulator 310, a digital calibration block 320 and a sinc decimation filter 330. The sigma delta modulator 310 receives an analog input and provides a coarse quantized signal $Y_C$ and a fine quantized signal $Y_F$ to calibration block 320. The analog input receives an analog signal to be converted in a normal operating mode and may be connected to ground in the calibration mode, as shown in FIG. 3. The sinc decimation filter 330 receives an output from digital calibration block 320 and provides a digital output Y in the normal operating mode. In the calibration mode, the sinc decimation filter 330 provides a time domain error signal e(n) to calibration block 320. The sigma delta modulator 310 also receives a test signal, such as a DC input $T_{DC}$ in the calibration mode, as discussed below.

The sigma delta modulator 310 includes a summing unit 340 which corresponds to the summing unit 110 of FIG. 2, a loop filter 342 which corresponds to the loop filter 120 of FIG. 2, a coarse/fine quantizer 344 which corresponds to the two-step quantizer 124 of FIG. 2 and a segmented DAC 350 which corresponds to the segmented DAC 140 of FIG. 2. The summing unit 340, the loop filter 342, the coarse/fine quantizer 344 and the segmented DAC 350 are connected in a feedback loop to form the sigma delta modulator 310. The sigma delta modulator 310 further includes a summing unit 360 which receives the coarse quantized signal $Y_C$ from the coarse/fine quantizer 344 at a first input and the test DC input $T_{DC}$ at a second input. The output of summing unit 360 is provided to the coarse DAC of the segmented DAC 350. The summing unit 360 enables the test DC input $T_{DC}$ to be injected into the feedback loop in the calibration mode.

The digital calibration block 320 includes recombination logic 370 and a calibration circuit 380. The recombination logic 370 includes a gain element 390 that receives the coarse quantized signal $Y_C$ and a gain element 392 that receives the fine quantized signal $Y_F$. The gain element 390 further receives a gain value from calibration circuit 380. Outputs of gain elements 390 and 392 are supplied to respective inputs of a summing unit 394 which provides an output to sinc decimation filter 330. The calibration circuit 380 receives the time domain error signal e(n) from the output of sinc decimation filter 330 and provides a gain value to gain element 390.

The calibration block 320 implements a calibration technique during a calibration mode of the segmented sigma-delta ADC 300. In particular, the segmented sigma-delta ADC 300 is provided with a normal operating mode and with a calibration mode. In the calibration mode, the calibration block 320 performs a calibration procedure to compensate for mismatch between the coarse DAC and the fine DAC of the segmented DAC 350. The calibration procedure is performed while the segmented sigma-delta ADC 300 is in the calibration mode, which can be activated during initial testing, automatically upon power up and/or upon request. After completion of the calibration procedure, the segmented sigma-delta ADC 300 can be switched to the normal operating mode.

The digital calibration technique replicates in the digital domain the mismatch between the average gains of the coarse DAC and the fine DAC in the segmented DAC 350. A calibration procedure is defined for this purpose. The primary analog input X is grounded and a digital test signal is injected into the loop at a digital node to excite the system. The test signal can be, for example, a random number or DC. The test signal input follows the same path as the quantization error and is subject to the high pass noise transfer function. In the presence of gain mismatch, some amount of unshaped quantization error persists in the band of interest in the output and increases its noise floor. But when the gain in the digital and analog sections are matched, it is possible to remove quantization error from the band of interest and the output because of the noise transfer function and produce a noise floor close to the ideal analog-to-digital converter. The calibration error minimizes the average power of time domain samples which include leaked quantization error due to mismatch appearing at the output of the sinc decimation filter 330 by using a least mean square (LMS) algorithm which adjusts the weight of gain element 390 adaptively until it is equal to the desired value of $(1-e) \, 2^{N_F}$.

Figure 4:
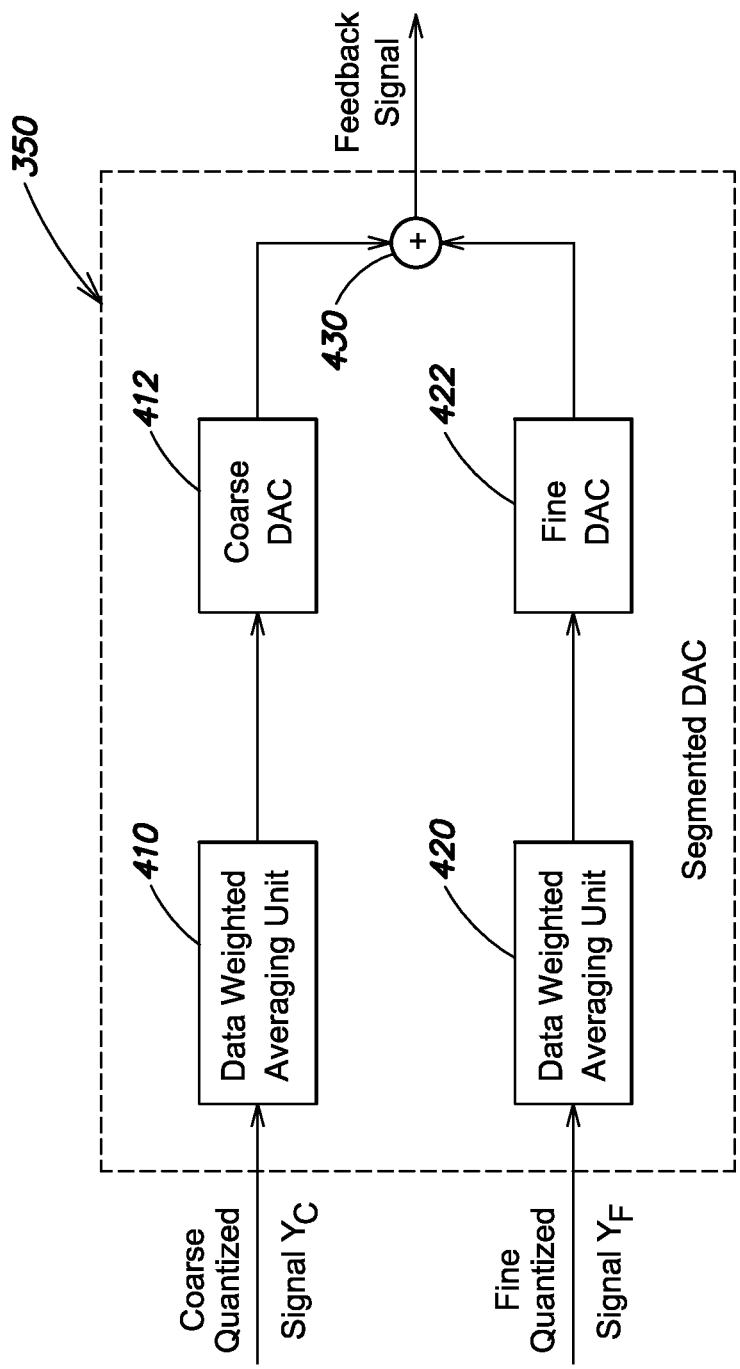
FIG. 4 is a schematic block diagram of the segmented DAC shown in FIG. 3, in accordance with embodiments.

A schematic block diagram of segmented DAC 350 in accordance with embodiments is shown in FIG. 4. The segmented DAC 350 includes a data weighted averaging unit 410, a coarse DAC 412, a data weighted averaging unit 420, a fine DAC 422 and a summing unit 430. The data weighted averaging unit 410 receives the coarse quantized signal $Y_C$ and provides an output to coarse DAC 412. The data weighted averaging unit 420 receives the fine quantized signal $Y_F$ and provides an output to fine DAC 422. Each data weighted averaging unit 410, 420 can be a scrambler as known in the art. The outputs of coarse DAC 412 and fine DAC 422 are provided to respective inputs of summing unit 430. The output of summing unit 430 is the feedback signal which is provided to summing unit 340 (FIG. 3) of the sigma delta modulator.

Figure 5:
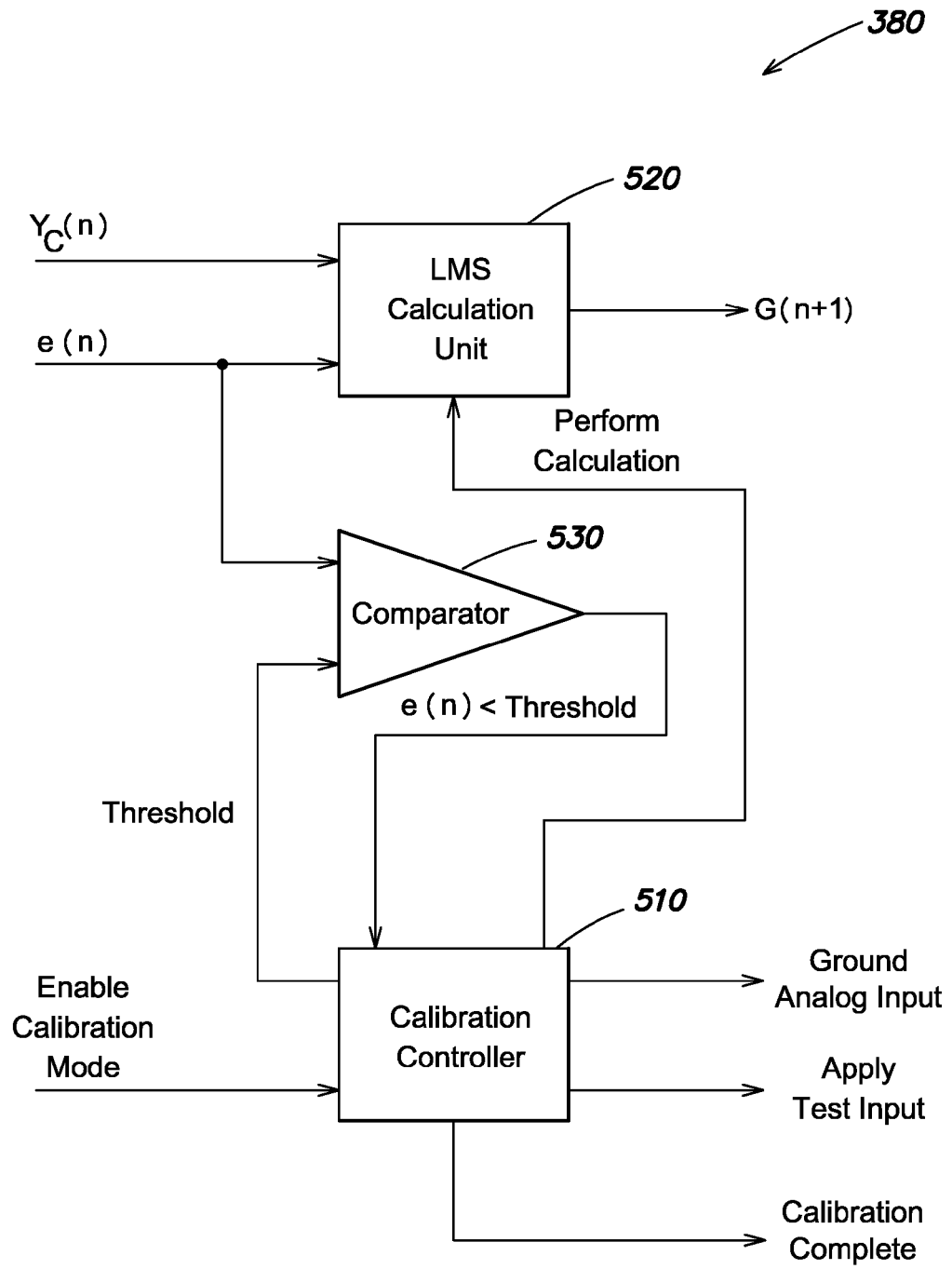
FIG. 5 is a schematic block diagram of the calibration circuit shown in FIG. 3, in accordance with embodiments.

A schematic block diagram of calibration circuit 380 in accordance with embodiments is shown in FIG. 5. The calibration circuit 380 includes a calibration controller 510, a Least Mean Square (LMS) calculation unit 520 and a comparator 530. The calibration controller 510 controls the calibration process during the calibration mode and disables the calibration functions during the normal operating mode. When the sigma delta ADC is placed in the calibration mode, as indicated by the Enable Calibration Mode signal, the calibration controller 510 controls a calibration procedure and provides a Calibration Complete signal when the calibration procedure is finished.

Initially, the calibration controller 510 grounds the Analog Input of the sigma delta ADC 300, as shown in FIG. 3, and applies a test DC input to summing unit 360, as also shown in FIG. 3. Under these operating conditions, the recombination logic 370 outputs an error signal e(n) representative of any mismatch between the coarse DAC 412 and the fine DAC 422. The calibration controller 510 then controls the comparator 530 to compare the error signal e(n) with a threshold value. If the error signal e(n) is greater than the threshold value, one or more iterations of the LMS calculation are performed. Each iteration generates an updated gain value G(n+1) according to a LMS algorithm and applies the updated gain value to the gain element 390 in recombination logic 370. It will be understood that different algorithms may be used for generating a gain value G(n+1), according to embodiments. The controller 510 then returns to check an updated value of the error signal (n+1). When the error signal e(n+1) is determined by comparator 530 to be less than the threshold value, the calibration procedure is complete, and the calibration controller 510 provides the Calibration Complete signal. The gain element 390 in recombination logic 370 operates with the determined gain value during the normal operating mode.

Figure 6:
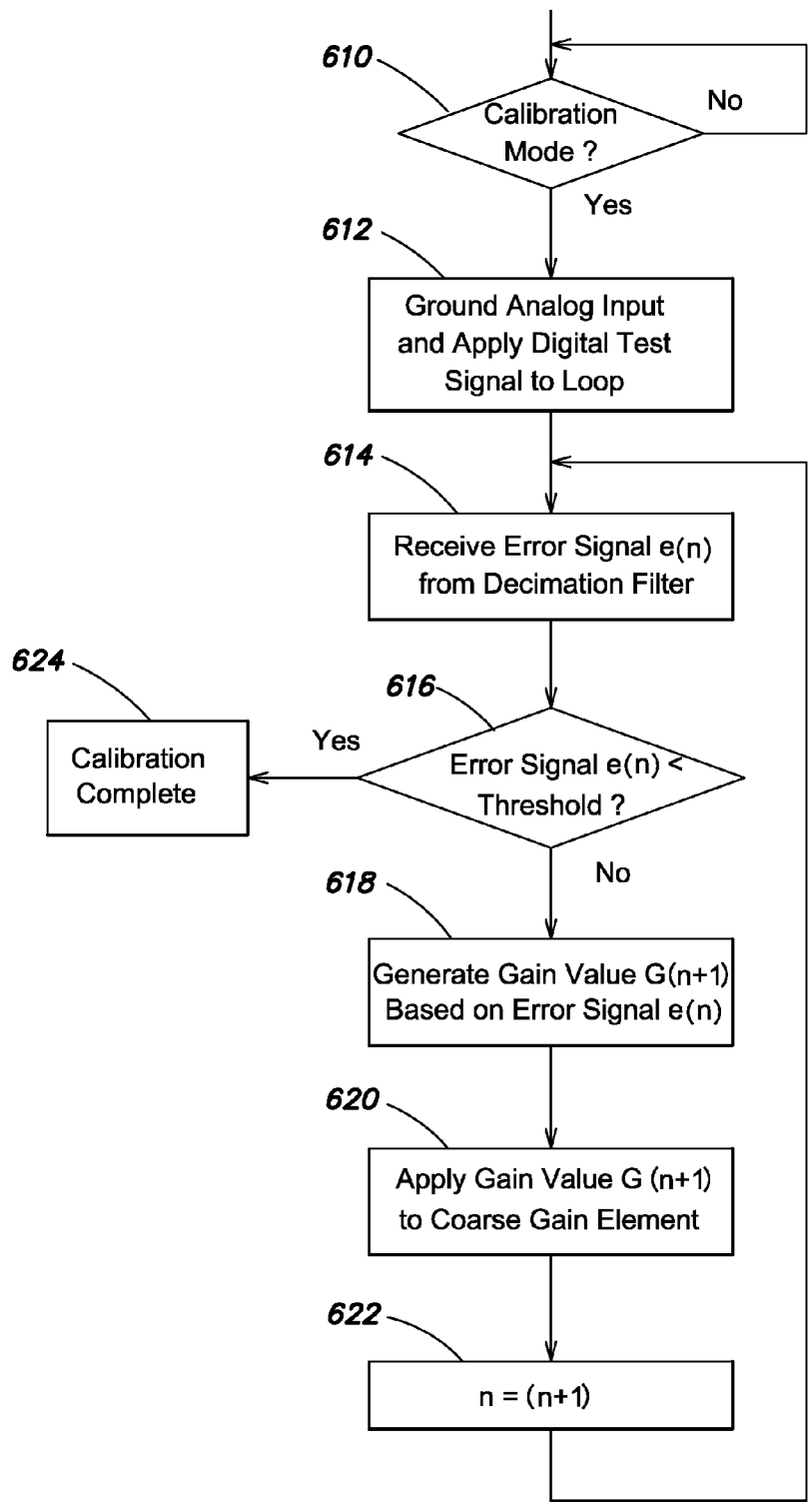
FIG. 6 is a flowchart of a calibration technique performed by the calibration circuit of FIG. 5, in accordance with embodiments.

An embodiment of a calibration process performed by the calibration circuit 380 is shown in FIG. 6. It will be understood that the acts shown in FIG. 6 may be performed in a different order and that the process may include additional acts.

In act 610, the calibration controller 510 determines if the sigma delta ADC 300 has been placed in the calibration mode. If the sigma delta ADC 300 is in the calibration mode, the calibration controller grounds the Analog Input, such as by closing a switch connected to ground, and applies the test signal to the loop at summing unit 360, in act 612.

In act 614, the comparator 530 receives the error signal e(n) from the decimation filter 330. In act 616, the comparator 530 compares the error signal e(n) with a threshold value. The threshold value may be a value which indicates that the gain of gain element 390 is substantially matched to the gain of coarse DAC 412 in segmented DAC 350.

If the error signal e(n) is determined in act 616 not to be less than the threshold, the calibration controller 510 instructs the LMS calculation unit 520 to generate an updated gain value G(n+1) based on the error signal e(n). In act 618, the updated gain value G(n+1) is calculated as follows:

$$G(n+1)=G(n)+mu \cdot Y_C(n) \cdot e(n) \quad (4)$$

where n is a time index, e(n) is the error signal from the decimation filter 330, mu is a step size of the LMS calculation, $Y_C(n)$ is the coarse quantized signal from the sigma delta modulator 310 and G(n) is a current gain value.

In act 620, the updated gain value G(n+1) is applied to the coarse gain element 390 in the recombination logic 370. In act 622, the time index n is incremented, and the process returns to act 614. The process including acts 614, 616, 618, 620 and 622 is repeated until it is determined in act 616 that the error signal e(n) is less than the threshold value. In this case, the calibration procedure is determined to be complete in act 624.

Having thus described at least one illustrative embodiment of the invention, various alterations, modifications and improvements will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A sigma delta analog-to-digital converter comprising:
a first summing unit having a first input to receive an analog input;
a loop filter configured to filter an output of the first summing unit;
a quantizer configured to quantize an output of the loop filter and to provide a coarse quantized signal and a fine quantized signal;
a segmented digital-to-analog converter (DAC) including a coarse DAC to receive the coarse quantized signal, a fine DAC to receive the fine quantized signal and a second summing unit to combine outputs of the coarse DAC and the fine DAC and to provide a feedback signal to a second input of the first summing unit;
recombination logic configured to combine the coarse quantized signal and the fine quantized signal; and
a calibration circuit, operable in a calibration mode, to calibrate the recombination logic to compensate for mismatch between the coarse DAC and the fine DAC of the segmented DAC.

2. The sigma delta analog-to-digital converter as defined in claim 1, wherein the recombination logic comprises a first gain element configured to process the coarse quantized signal, a second gain element configured to process the fine quantized signal and a third summing unit configured to combine outputs of the first and second gain elements.

3. The sigma delta analog-to-digital converter as defined in claim 2, wherein the calibration circuit adjusts a gain value of the first gain element to an average gain of the coarse DAC.

4. The sigma delta analog-to-digital converter as defined in claim 3, wherein the second gain element is configured to have unity gain.

5. The sigma delta analog-to-digital converter as defined in claim 1, further comprising a decimation filter coupled to an output of the recombination logic, wherein the decimation filter provides an error signal to the calibration circuit in the calibration mode.

6. The sigma delta analog-to-digital converter as defined in claim 5, wherein the decimation filter comprises a sinc decimation filter.

7. The sigma delta analog-to-digital converter as defined in claim 5, wherein the calibration circuit includes a calibration controller adapted to configure the sigma delta analog-to-digital converter for calibration and to control a calibration process.

8. The sigma delta analog-to-digital converter as defined in claim 7, wherein the calibration circuit further includes a calculation unit configured to generate an updated gain value.

9. The sigma delta analog-to-digital converter as defined in claim 8, wherein the updated gain value adjusts a gain of the coarse quantized signal in the recombination logic.

10. The sigma delta analog-to-digital converter as defined in claim 8, wherein the calculation unit implements a Least Mean Square algorithm.

11. The sigma delta analog-to-digital converter as defined in claim 10, wherein the calculation unit generates the updated gain value G(n+1) as follows:

$$G(n+1)=G(n)+mu \cdot Y_C(n) \cdot e(n)$$

where n is a time index, e(n) is the error signal, mu is a step size of the Least Mean Square algorithm, $Y_C(n)$ is the coarse quantized signal and G(n) is a current gain value.

12. The sigma delta analog-to-digital converter as defined in claim 7, wherein the calibration controller is configured to ground the analog input and to apply a digital test value to the sigma delta analog-to-digital converter in the calibration mode.

13. The sigma delta analog-to-digital converter as defined in claim 5, wherein the calibration circuit further includes a comparator configured to compare the error signal with a threshold value.

14. The sigma delta analog-to-digital converter as defined in claim 13, wherein the calibration controller is configured to execute iterations of generating an updated gain value while the error signal is greater than the threshold value.

15. The sigma delta analog-to-digital converter as defined in claim 1, wherein the segmented digital-to-analog converter includes a first data weighted averaging unit operable with the coarse DAC and a second data weighted averaging unit operable with the fine DAC.

16. In a sigma delta analog-to-digital converter having a segmented digital-to-analog converter (DAC) and recombination logic, a calibration method comprising:
    detecting an error signal representative of gain mismatch between a coarse DAC and a fine DAC in the segmented DAC; and
    adjusting a gain of a gain element in the recombination logic to compensate for the gain mismatch, based on the error signal.

17. The calibration method as defined in claim 16, wherein detecting the error signal includes receiving the error signal from a decimation filter coupled to an output of the recombination logic.

18. The calibration method as defined in claim 17, wherein adjusting the gain includes generating an updated gain value of the gain element.

19. The calibration method as defined in claim 18, wherein generating the updated gain value is based on a Least Mean Square algorithm.

20. The calibration method as defined in claim 17, further comprising grounding an analog input of the sigma delta analog-to-digital converter and applying a digital test value to the sigma delta analog-to-digital converter.

21. The calibration method as defined in claim 16, wherein adjusting the gain includes generating an updated gain value $G(n+1)$ as follows:

$$G(n+1)=G(n)+mu \cdot Y_C(n) \cdot e(n)$$

where n is a time index, $e(n)$ is the error signal, mu is a step size of the Least Mean Square algorithm, $Y_C(n)$ is the coarse quantized signal and $G(n)$ is a current gain value.

22. The calibration method as defined in claim 16, wherein adjusting the gain includes adjusting the gain of the gain element to an average gain of the coarse DAC.

23. The calibration method as defined in claim 16, wherein adjusting the gain includes executing iterations of generating an updated gain value while the error signal is greater than a threshold value.

24. A sigma delta analog-to-digital converter comprising:
    a sigma delta modulator including a segmented digital-to-analog converter (DAC), the segmented DAC including a coarse DAC and a fine DAC, wherein the sigma delta modulator is configured to generate a coarse quantized signal and a fine quantized signal;
    recombination logic configured to combine the coarse quantized signal and the fine quantized signal; and
    a calibration circuit, operable in a calibration mode, to calibrate the recombination logic to compensate for mismatch between the coarse DAC and the fine DAC of the segmented DAC.

* * * * *